United States Patent [19]

McClure

[11] Patent Number: 5,768,206
[45] Date of Patent: Jun. 16, 1998

[54] CIRCUIT AND METHOD FOR BIASING BIT LINES

[75] Inventor: David C. McClure, Carrollton, Tex.

[73] Assignee: SGS-Thomson Microelectronics, Inc., Carrollton, Tex.

[21] Appl. No.: 484,491

[22] Filed: Jun. 7, 1995

[51] Int. Cl.$^6$ .............................. G11C 7/00; G11C 29/00
[52] U.S. Cl. .............................. 365/225.7; 365/189.11; 365/200
[58] Field of Search .............................. 365/200, 189.11, 365/225.7, 189.06, 202, 190; 327/525, 526

[56] References Cited

U.S. PATENT DOCUMENTS

| | | |
|---|---|---|
| 4,297,721 | 10/1981 | McKenny et al. .................. 357/59 |
| 5,187,114 | 2/1993 | Chan et al. ............................ 437/52 |
| 5,257,229 | 10/1993 | McClure et al. ..................... 365/200 |
| 5,355,340 | 10/1994 | Coker et al. ......................... 365/200 |
| 5,390,150 | 2/1995 | Kwak .................................... 365/200 |
| 5,392,243 | 2/1995 | Nakamura ............................ 365/190 |
| 5,412,606 | 5/1995 | Lee ........................................ 365/190 |
| 5,414,668 | 5/1995 | Nakashima ......................... 365/225.7 |

Primary Examiner—David C. Nelms
Assistant Examiner—Son Mai
Attorney, Agent, or Firm—David V. Carlson; Theodore E. Galanthay; Lisa K. Jorgenson

[57] ABSTRACT

A circuit biases an associated pair of bit lines. A fuse is coupled between a biasing voltage and a node. A first load is coupled between the node and a first of the bit lines. A second load is coupled between the node and a second of the bit lines.

25 Claims, 2 Drawing Sheets

CIRCUIT AND METHOD FOR BIASING BIT LINES

TECHNICAL FIELD

The present invention relates generally to electronic devices and more specifically to a device for biasing memory-column bit lines with a pull-up or bias voltage.

BACKGROUND OF THE INVENTION

Many existing memory devices, such as a static random access memory (SRAM), include an array of redundant memory cells to replace defective matrix memory cells. Typically, if a defective matrix memory cell is discovered during initial testing of the memory device, the entire memory column that contains the defective cell is identified as defective. The testing apparatus then programs the memory device to substitute for the defective column a column of redundant memory cells. This substitution is usually transparent to external circuitry, such as a microprocessor or other computing circuitry, with which the memory device may later be used.

There are at least two types of existing memory devices that have redundant memory. In the first, the defective column must be disconnected from the read-write circuitry in order to prevent data bus conflicts during a read operation. That is, if the defective column is not disconnected, both it and the substitute redundant column may simultaneously try to load data onto the data bus during a read operation. Such simultaneous data loading may cause a read error. An example of the first type of memory device is disclosed in U.S. Pat. No. 5,355,340, which issued to Coker et al. on 11 Oct. 1994 and is incorporated by reference herein.

In the second type of existing memory device, because the data from the matrix and redundant columns is multiplexed onto the data bus, the defective column need not be disconnected to prevent data errors. The defective column, however, is often disconnected from the read-write circuit to prevent its drawing a standby current from the bias voltage. Such a standby current, which is typically caused by a short circuit or other abnormality that has rendered the column defective, wastes power and increases the heat generated by the memory device. An example of the second type of memory device is disclosed in U.S. Pat. No. 5,257,229, which issued to McClure et al. on 26 Oct. 1993 and is incorporated by reference herein.

FIG. 1 shows a circuit diagram of an existing circuit that is often used in both types of existing memory devices to disconnect a defective column 16 of the matrix memory cells 14 from the read-write circuit 10. As shown, read-write circuit 10 is coupled to an array 12 of the matrix cells 14. For simplicity of description, only the portions of read-write circuit 10 and array 12 that are associated with one column 16 are shown, it being understood that array 12 includes multiple columns 16 that are each associated with similar read-write circuitry.

Read-write circuit 10 includes sense amplifier and drive circuit 18 for reading from and writing to the memory cells 14 of column 16. As shown, a bias circuit 20 couples circuit 14 to the complementary bit lines BL and $\overline{BL}$ of memory column 16. Circuit 20 includes a pair of load devices 22 and 24 and a pair of fuses 26 and 28. The loads 22 and 24 both have a first terminal coupled to a respective one of fuses 26 and 28, and a second terminal coupled to a pull-up or bias voltage, here power-supply voltage $V_{CC}$.

In operation, to disconnect a defective column 16 from circuit 10, both fuses 26 and 28 are severed or blown, such that they act as open circuits. Thus, in both the first and second type of memory circuits discussed above, the blowing of fuses 26 and 28 both disconnects the defective column 16 from circuit 18 (and thus from the data bus) and from the bias voltage. Such disconnection prevents the defective column 16 from causing any read errors or from drawing a standby current from the bias-voltage supply.

One problem with bias circuit 20 is that it requires two fuses for each column 16. These many fuses occupy a substantial area of the memory device, and thus increase its size. Furthermore, because BL and $\overline{BL}$ of each column and adjacent columns typically have a high pitch, i.e., are very close together (in some cases, within 3-5 microns). Fuses 26 and 28 also have a high pitch. Where fuses 26 and 28 are laser fuses, this high pitch increases the probability of error in cutting the fuses. For example, the laser may cut adjacent fuses associated with non-defective columns.

SUMMARY OF THE INVENTION

In accordance with one aspect of the present invention, a circuit is provided for biasing an associated number of bit lines. A fuse is coupled between a biasing voltage and a node. A first load is coupled between the node and a first of the bit lines. A second load is coupled between the node and a second of the bit lines. Such a circuit is suitable for use in memory devices, including integrated memory circuits.

An advantage provided by one aspect of the present invention is a reduction in the number of bias fuses.

An advantage provided by another aspect of the present invention is an increase in the clearance, i.e., a decrease in the pitch, between adjacent fuses.

DETAILED DESCRIPTION OF THE INVENTION

Figure 1:
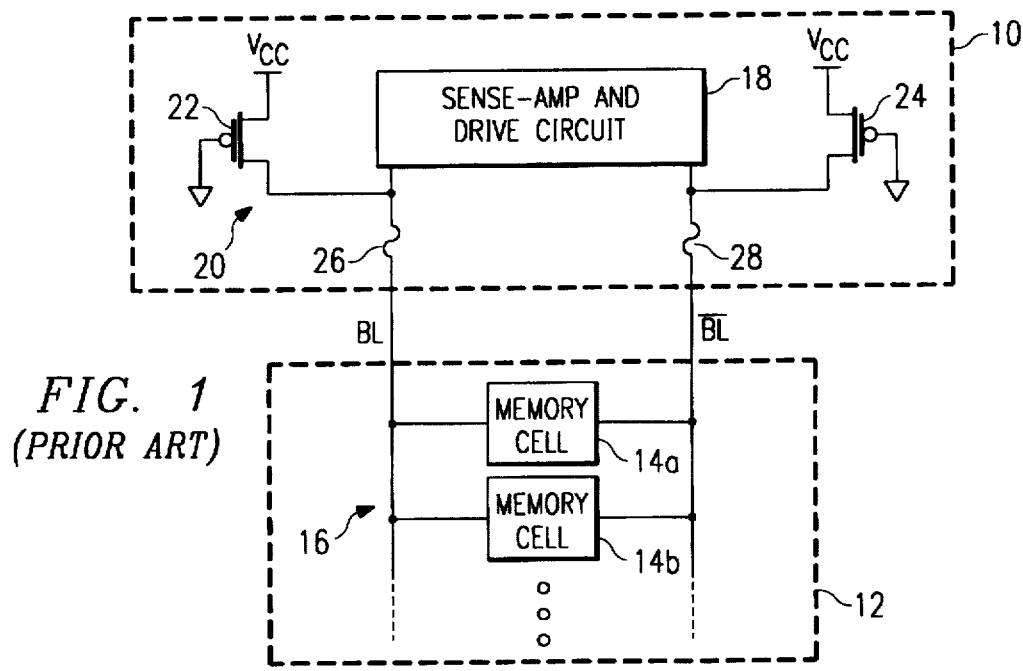
FIG. 1 is a circuit diagram of a known bit-line bias circuit.
Figure 2:
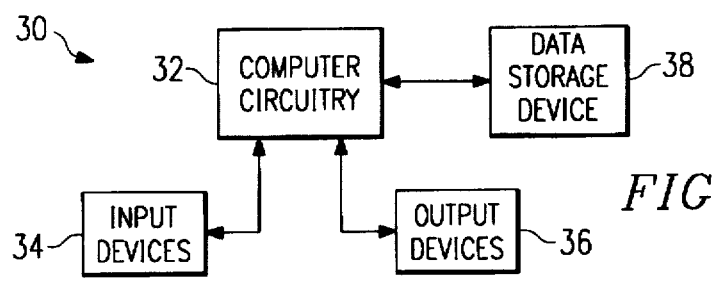
FIG. 2 is a block diagram of a computer system that is in accordance with the invention.

FIG. 2 is a block diagram of a computer system 30 according to the present invention. The computer system 30 includes computer circuitry 32 for performing computer functions, such as executing software to perform desired calculations and tasks. Circuitry 32 typically contains a processor. One or more input devices 34, such as a keypad or a mouse, are coupled to computer circuitry 32 and allow an operator (not shown) to manually input data thereto. One or more output devices 36 are coupled to computer circuitry 32 to provide to the operator data generated by computer circuitry 32. Examples of output devices 36 include a printer and a video display unit. One or more data storage devices 38 are coupled to computer circuitry 32 to store data on or retrieve data from external storage media (not shown). Examples of storage devices 38 and storage media include drives that accept hard and floppy disks, tape cassettes, and compact-disk read only memories (CD-ROMs).

Figure 3:
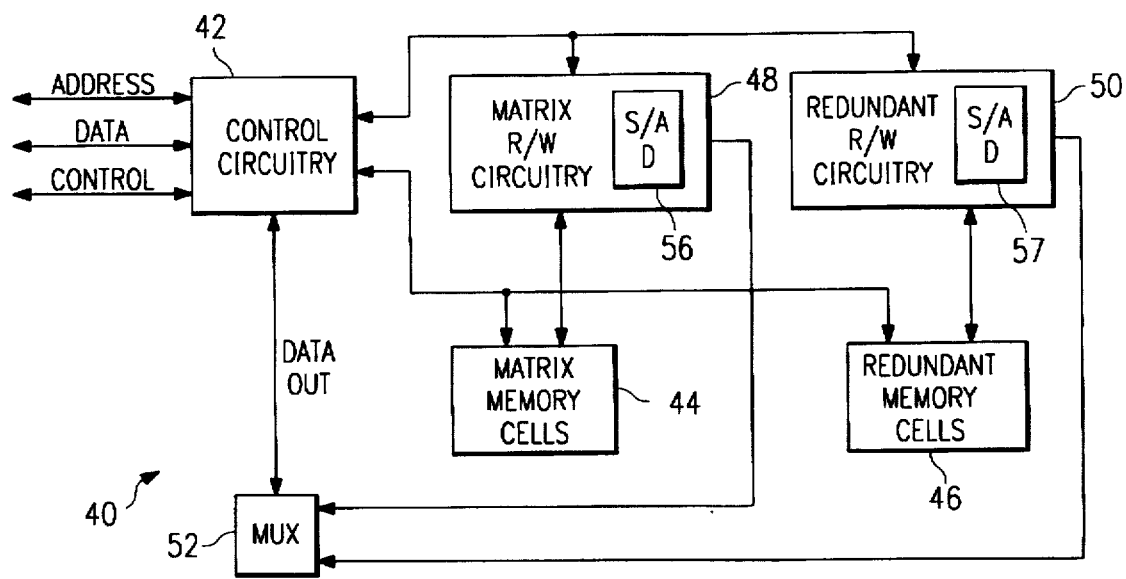
FIG. 3 is a block diagram of one embodiment of a memory device that forms a portion of the computing circuitry of FIG. 2.

FIG. 3 is a block diagram of one embodiment of a memory device 40 according to the present invention. Memory device 40 may form part of and store data internally for computer circuitry 32 (FIG. 2). In one aspect of the invention, memory device 40 is a static random access memory (SRAM). Memory device 40 includes a control circuit 42 that receives address, data, and control signals from the address, data, and control busses, respectively. These busses are typically coupled to external circuitry that generates the address, data, and control signals. Such external circuitry is often found in computer circuitry 32. Memory 40 also includes an array 44 of matrix memory cells 54 (FIG. 4) and an array 46 of redundant memory cells. A matrix read-write circuit 48 is coupled to both control circuitry 42 and array 44 and includes matrix sense amplifier and drive circuitry 56 for reading data from and writing data to the matrix memory cells 54. Likewise, redundant read-write circuit 50, which is coupled to control circuit 42 and redundant array 46, includes redundant sense amplifier and drive circuitry 57 that reads data from and writes data to the redundant memory cells of array 46. During a read cycle, a multiplexer 52 receives data from either or both matrix read-write circuit 48 and redundant read-write circuit 50. In response to one or more control signals from control circuit 42, multiplexer 52 selectively couples data from either of circuits 48 or 50 to the data bus via control circuit 42. Thus, multiplexer 52 prevents any read-data conflicts on the data bus between matrix and redundant read-write circuits 48 and 50.

Figure 4:
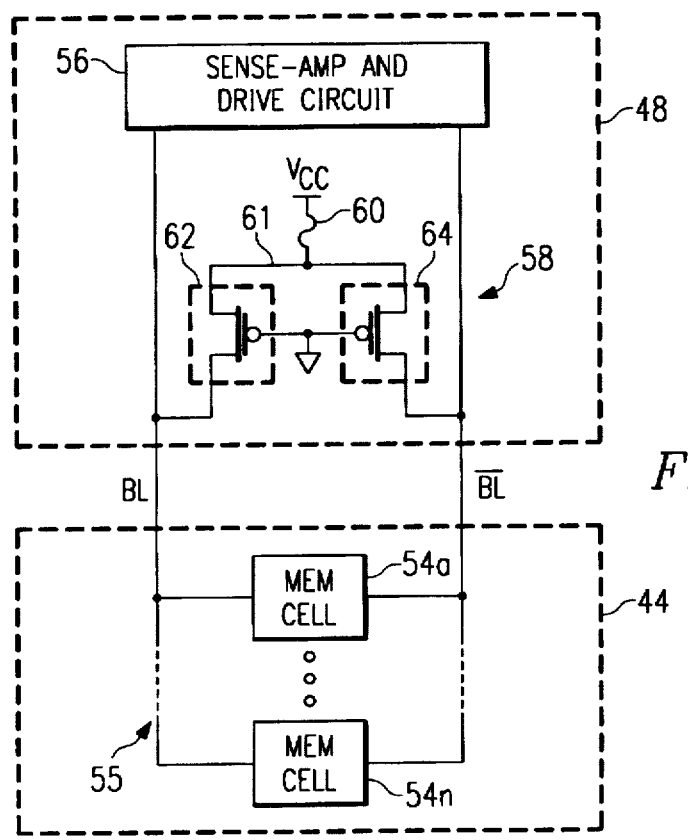
FIG. 4 is a circuit diagram of a portion of the matrix read-write circuitry of FIG. 3.

FIG. 4 is a circuit diagram, which, for simplicity of explanation, shows portions of matrix read-write circuit 48 and array 44 that are associated with a single column 55 of memory cells 54. As discussed above in conjunction with FIG. 3, circuit 48 includes a sense amp and drive circuit 56 for reading data from and writing data to memory cells 54 via complementary bit lines BL and $\overline{BL}$. There may be one circuit 56 for each column 55, or control circuit 42 (FIG. 3) may couple circuit 56 to a column 55 that has been selected to be read from or written to. In one aspect of the invention, memory cells 54 are four-transistor, i.e., 4-T, SRAM cells. An example of a 4-T cell is disclosed in U.S. Pat. No. 4,297,721, which issued to McKenny et al. on 27 Oct. 1981 and is incorporated by reference herein. In another aspect of the invention, memory cells 54 are six-transistor, i.e., 6-T, SRAM cells. Examples of a 6-T cell are disclosed in U.S. Pat. No. 5,187,114, which issued to Chan et al. on 16 Feb. 1993 and is incorporated by reference herein.

Circuit 48 also includes for each column 55 a bias circuit 58 for coupling a pull-up voltage, here supply voltage $V_{CC}$, to both bit lines BL and $\overline{BL}$. As shown, circuit 58 includes a single fuse 60 that is coupled between the pull-up voltage and a node 61 to which one terminal from each of a pair of loads 62 and 64 are coupled. The remaining terminal of each of the loads 62 and 64 is coupled to a respective one of bit lines BL and $\overline{BL}$. For example, as shown, load device 62 is coupled between node 61 and bit line BL, and load 64 is coupled between node 61 and bit line $\overline{BL}$. Fuse 60 may be of a machine-cuttable type, such as a laser fuse, an electrically blowable fuse, or another type of fuse. Furthermore, because each of matrix and redundant arrays 44 and 46 has its own sense amplifier and drive circuitry 56 and 57 respectively (as opposed to sharing such circuitry), there is often no need to disconnect a defective column in matrix array 44 sense amplifier and driver circuitry 56.

In one aspect of the invention, loads 62 and 64 include transistors having their power-supply input terminals coupled to fuse 60, their control terminals coupled to a control voltage, and their drive terminals coupled respectively to bit lines BL and $\overline{BL}$. More specifically, in this embodiment, loads 62 and 64 are long-channel p-type transistors having their sources coupled to fuse 60, their gates coupled to a reference voltage (here ground), and their drains respectively coupled to bit lines BL and $\overline{BL}$. The present invention, however, contemplates the use of other types of load elements for loads 62 and 64.

In operation, if column 55 is found to be defective, fuse 60 is blown to decouple bit lines BL and $\overline{BL}$ from the pull-up voltage $V_{CC}$, and to thus prevent the defective column 55 from drawing any standby current from the pull-up-voltage supply. As shown, because bit lines BL and $\overline{BL}$ remain coupled to sense amp and drive circuit 56, bias circuit 58 is suitable for use in a memory device, such as memory device 40, where a defective column 55 need not be decoupled from the matrix read-write circuitry 48 to prevent data errors.

One advantage of bias circuit 58 is that it uses only one fuse 60 per column 55 instead of two fuses. Such a reduction in the number of fuses, here by half, often greatly reduces the layout area of memory device 40 occupied by fuses 60. Also, with half as many fuses 60, there is approximately twice the distance between them. If machine-cuttable fuses, such as laser fuse, are used, this decrease in the pitch of fuses 60 often reduces the number of cutting errors.

Figure 5A:
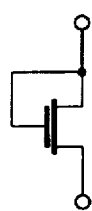
FIGS. 5A-D are examples of loads that may be used in the bias circuit of FIG. 4.
Figure 5B:
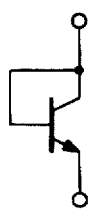
Figure 5C:
Figure 5D:

FIGS. 5A–D show other examples of devices and elements that can be used for loads 62 and 64. FIG. 5A shows an n-channel transistor configured in a diode configuration. FIG. 5B shows an npn bipolar transistor configured in a diode configuration. FIG. 5C shows a pnp bipolar transistor configured as a load device in a similar fashion to the p-channel transistors of FIG. 4. FIG. 5D shows a resistor, which in one embodiment may be formed from polysilicon.

Figure 6:
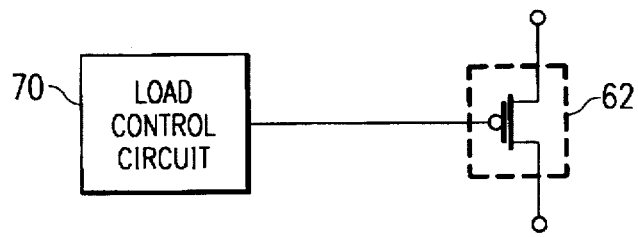
FIG. 6 is a block diagram of a load control circuit that is suitable for use with the circuitry of FIG. 4.

FIG. 6 is a load control circuit 70 that generates a control voltage to control pull-up load elements 62 and 64 (FIG. 4). For clarity, only load element 62 is shown as a p-channel transistor. The load elements of FIG. 5A–C, however, may be used with circuit 70 as well. In one embodiment, circuit 70 generates a clock signal that periodically activates loads 62 and 64 to pull up bit lines BL and $\overline{BL}$. In another embodiment, circuit 70 is an edge transition detector that activates loads 62 and 64 for a period of time prior to the beginning of each read or write cycle. Thus, circuit 70 activates load elements 62 and 64 to precharge the bit lines BL and $\overline{BL}$, and then deactivates the load elements so that the active memory cell 54 or the drive circuitry 56 need not sink current from the loads during a read or write cycle.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A memory circuit, comprising:

a plurality of memory cells arranged in one or more columns, each column including first and second bit lines, each cell coupled to said bit lines of one of said columns;

one or more fuses each associated with one of said columns, each of said fuses having a first terminal coupled to a bias voltage and having a second terminal; and one or more pairs of loads, each pair associated with one of said columns, said each pair including a first load coupled between said second terminal of an associated fuse and said first bit line of an associated column, said each pair including a second load coupled between said second terminal of said associated fuse and said second bit line of said associated column.

2. A method comprising:

providing one or more memory columns each including complementary first and second bit lines;

coupling a first terminal of a fuse to a bias voltage;

coupling a first load between said first bit line of a column and a second terminal of said fuse; and coupling a second load between said second bit line of said column and said second terminal of said fuse.

3. A method, comprising:

coupling first and second bit lines of each of a plurality of memory columns to a bias voltage via a corresponding path that is common to said first and second bit lines; and making the path corresponding to one of said memory columns nonconductive to isolate said one memory column from said bias voltage.

4. The method of claim 3, further comprising forming said path including a fuse element.

5. The circuit of claim 1 wherein said fuses each comprise a laser-cuttable fuse.

6. The circuit of claim 1 wherein said loads each comprise an n-channel transistor that is connected in a diode configuration.

7. The circuit of claim 1 wherein said loads each comprise an npn transistor that is connected in a diode configuration.

8. The circuit of claim 1 wherein said loads each comprise a p-channel transistor having a gate coupled to a control voltage, and a source and drain coupled between said second terminal of said associated fuse and a respective one of said bit lines.

9. The circuit of claim 1 wherein said loads each comprise a pnp transistor having a base coupled to a control voltage, and a collector and emitter coupled between said second terminal of said associated fuse and a respective one of said bit lines.

10. The circuit of claim 1 wherein said fuses each comprise an electrically blowable fuse.

11. The circuit of claim 1 wherein said first and second loads each comprise a diode-coupled transistor.

12. The circuit of claim 1 wherein said first and second loads each comprise a control terminal coupled to a control voltage, a supply terminal coupled to said second terminal of said associated fuse, and a drive terminal coupled to a respective one of said bit lines.

13. A static random access memory coupled to external circuitry via address, data, and control busses, comprising:

a control circuit coupled to said address, data, and control busses;

an array of matrix memory cells that are arranged in rows and columns, each cell coupled to a complementary pair of bit lines of one of said columns, said array coupled to said control circuit; and a matrix read-write circuit coupled to said control circuit and said array and comprising, a first drive circuit that can be coupled to said bit lines of a selected column and is operable to load data into a selected cell, a first sense amplifier that can be coupled to said bit lines of a selected column and is operable to read data from a selected cell, a fuse associated with each of said columns, each fuse having a first fuse terminal coupled to a bias voltage, and having a second fuse terminal, and first and second loads associated with each of said columns, each load having a first terminal coupled to a respective associated bit line and a second terminal coupled to said second fuse terminal of an associated fuse.

14. The memory circuit of claim 13 wherein said fuses each comprises a laser fuse.

15. The memory circuit of claim 13 further comprising a load controller that generates a control signal at an output terminal, and wherein said loads each comprise a control terminal coupled to said output terminal, and a supply terminal and a drive terminal coupled between said first and second terminals.

16. The memory circuit of claim 13 further comprising:

an array of redundant memory cells coupled to said control circuit;

a redundant read-write circuit coupled to said redundant array and said control circuit; and a multiplexer coupled to said matrix and redundant arrays and said control circuit and operable to selectively couple data from said matrix array or said redundant array to said control circuit.

17. The memory circuit of claim 16 wherein said redundant read-write circuit comprises:

a second drive circuit; and a second sense amplifier.

18. A computer system, comprising:

a data input device;

a data output device; and computing circuitry coupled to said data input and output devices and including address, data, and control busses, and a memory circuit that comprises, a control circuit coupled to said address, data, and control busses, an array of matrix memory cells that are arranged in columns, each column including a pair of complementary bit lines, each cell coupled to said bit lines of one of said columns, said array coupled to said control circuit, and a circuit coupled to said control circuit and said array and operable to read data from and write data to said cells, comprising, a first drive circuit operable to be coupled to said bit lines of a selected column and to load data into a selected cell, a first sense amplifier operable to be coupled to said bit lines of a selected column and to retrieve data from a selected cell, a plurality of fuses each associated with one of said columns, each fuse having a first fuse terminal coupled to a bias voltage, and having a second fuse terminal, and a plurality of loads each associated with one of said bit lines, each load having a first terminal coupled to an associated bit line and a second terminal coupled to said second fuse terminal of an associated fuse.

19. The computer system of claim 18 wherein each of said fuses comprises a laser fuse.

20. The computer system of claim 18 wherein said loads each comprise a transistor having a control terminal coupled to a control voltage, and a supply terminal and a drive terminal coupled between said first and second terminals.

21. The computer system of claim 18 wherein said memory circuit further comprises:

an array of redundant memory cells coupled to said control circuit;

a redundant read-write circuit coupled to said redundant array and said control circuit; and a multiplexer coupled to said matrix and redundant arrays and said control circuit and operable to selectively couple data from either said matrix array or said redundant array to said data bus via said control circuit.

22. The computer system of claim 21 wherein said redundant read-write circuit comprises:

a second drive circuit; and a second sense amplifier.

23. The method of claim 2 wherein said fuses each comprise a laser-cuttable fuse.

24. The method of claim 2 wherein said first loads and said second loads each comprise a transistor that is connected in a diode configuration.

25. The method of claim 2 wherein said first loads and said second loads each comprise a transistor having a control terminal coupled to a control voltage, and a supply and drive terminal coupled between said second terminal of a corresponding one of said fuses and a respective one of said bit lines.

* * * * *